(12) United States Patent
Frolov et al.

(10) Patent No.: US 9,391,457 B2
(45) Date of Patent: Jul. 12, 2016

(54) APPARATUS AND METHOD FOR PRODUCING AC POWER

(71) Applicant: Sunlight Photonics Inc., Edison, NJ (US)

(72) Inventors: Sergey Frolov, Murray Hill, NJ (US); Allan James Bruce, Scotch Plains, NJ (US); Michael Cyrus, Summit, NJ (US)

(73) Assignee: SUNLIGHT PHOTONICS INC., Edison, NJ (US)

( * ) Notice: Subject to any disclaimer, the term of this patent is extended or adjusted under 35 U.S.C. 154(b) by 651 days.

(21) Appl. No.: 13/631,158

(22) Filed: Sep. 28, 2012

(65) Prior Publication Data
US 2013/0043733 A1 Feb. 21, 2013

Related U.S. Application Data

(63) Continuation of application No. 12/247,085, filed on Oct. 7, 2008, now abandoned.

(51) Int. Cl.
| | |
|---|---|
| *H02J 3/00* | (2006.01) |
| *H02J 3/38* | (2006.01) |
| *H01L 31/02* | (2006.01) |
| *H01L 31/0236* | (2006.01) |
| *H01L 31/0687* | (2012.01) |
| *H01L 31/076* | (2012.01) |

(52) U.S. Cl.
CPC ............ *H02J 3/383* (2013.01); *H01L 31/02021* (2013.01); *H01L 31/02366* (2013.01); *H01L 31/0687* (2013.01); *H01L 31/076* (2013.01); *Y02E 10/544* (2013.01); *Y02E 10/548* (2013.01); *Y02E 10/563* (2013.01); *Y02P 70/521* (2015.11); *Y10T 307/707* (2015.04)

(58) Field of Classification Search
CPC .............................. Y10T 307/707; H02J 3/385
USPC ................................................. 307/77, 82, 84
See application file for complete search history.

(56) References Cited

U.S. PATENT DOCUMENTS

| | | |
|---|---|---|
| 6,111,767 A | 8/2000 | Handleman |
| 7,158,395 B2 | 1/2007 | Deng et al. |
| 2002/0038667 A1 | 4/2002 | Kondo et al. |
| 2003/0067723 A1 | 4/2003 | Suzui et al. |
| 2003/0223257 A1 | 12/2003 | Onoe |
| 2004/0159102 A1 | 8/2004 | Toyomura et al. |
| 2005/0056312 A1 | 3/2005 | Young et al. |
| 2007/0103108 A1 | 5/2007 | Capp et al. |

(Continued)

FOREIGN PATENT DOCUMENTS

JP 2002305886 A 10/2002

*Primary Examiner* — Fritz M Fleming
(74) *Attorney, Agent, or Firm* — Stuart H. Mayer; Mayer & Williams PC (57) ABSTRACT

A multi-input electrical power conversion device is provided for converting multiple DC energies each arising from different junctions in a multi-junction solar cells into AC energy. The device includes a plurality of electrical inputs for receiving the multiple DC energies from at least one multi junction solar cell. The number of DC energies id no less than the number of junctions in the multi-junction solar cell. The device also includes at least one DC-to-AC circuit for receiving the multiple DC energies from the plurality of electrical inputs and at least one electrical output receiving at least one AC energy from the DC to AC circuit. The device also includes at least one MPPT circuit operatively coupled to the DC to AC circuit.

30 Claims, 9 Drawing Sheets

(56) References Cited

U.S. PATENT DOCUMENTS

| | | |
|---|---|---|
| 2007/0159866 A1 | 7/2007 | Siri |
| 2007/0164612 A1 | 7/2007 | Wendt et al. |
| 2008/0036440 A1 | 2/2008 | Garmer |
| 2008/0143188 A1 | 6/2008 | Adest et al. |
| 2008/0216885 A1* | 9/2008 | Frolov et al. .......... 136/244 |

* cited by examiner

APPARATUS AND METHOD FOR PRODUCING AC POWER

BACKGROUND

1. Field

The present invention relates to photovoltaic devices and methods of producing such devices. More particularly, the present invention relates to photovoltaic modules that are composed of solar cells having multiple photovoltaic junctions, additional means of converting electrical energy and direct electrical connection of such modules to the electrical utility grid.

2. Related Art

Photovoltaic devices represent one of the major sources of environmentally clean and renewable energy. They are frequently used to convert optical energy into electrical energy. Typically, a photovoltaic device is made of one or more semiconducting material with p-doped and n-doped regions. The conversion efficiency of solar power into electricity of this device is limited to a maximum of about 37%, since photon energy in excess of the semiconductor's bandgap is wasted as heat. A photovoltaic device with multiple semiconductor layers of different bandgaps is more efficient: an optimized two-bandgap photovoltaic device has a maximum solar conversion efficiency of 50%, whereas a three-bandgap photovoltaic device has a maximum solar conversion efficiency of 56%. Realized efficiencies are typically less than theoretical values in all cases.

Multi-layered or multi junction devices are currently manufactured as monolithic wafers, where each semiconductor layer is crystal-grown on top of the previous one. As a result, the semiconductor layers are electrically connected in series and have to be current-matched, in order to obtain maximum conversion efficiency. This current-matching procedure complicates the design and decreases the efficiency of the device. The latter becomes particularly evident when considering the effect of spectral filtering on the device efficiency. If a part of the solar spectrum is absorbed or scattered, e.g. by water vapors, the resulting disproportional decrease of photocurrent in one of junctions will limit the current through the whole device and thus decrease its conversion efficiency.

SUMMARY

In accordance with the present invention, a multi-input electrical power conversion device is provided for converting multiple DC energies each arising from different junctions in multi junction solar cells into AC energy. The device includes a plurality of electrical inputs for receiving the multiple DC energies from at least one multi junction solar cell. The number of DC energies is no less than the number of junctions in the multi junction solar cell. The device also includes at least one DC-to-AC circuit for receiving the multiple DC energies from the plurality of electrical inputs and at least one electrical output receiving at least one AC energy from the DC to AC circuit. The device also includes at least one MPPT circuit operatively coupled to the DC to AC circuit.

In accordance with one aspect of the invention, the electrical power conversion device of claim 1 further comprising an AC disconnect switch for disconnecting the electrical output under control of the MPPT circuit.

In accordance with another aspect of the invention, The electrical power conversion device of claim 1 further comprising at least one DC to DC circuit coupling the electrical inputs to the DC to AC circuit.

In accordance with another aspect of the invention, the electrical power conversion device further comprises a number of DC-to-AC conversion circuits that is equal to the number of DC energies.

In accordance with another aspect of the invention, the electrical power conversion device further comprises a number of DC-to-DC conversion circuits that is equal to the number of DC energies.

In accordance with another aspect of the invention, the electrical power conversion device further comprises a number of MPPT circuits that is equal to the number of DC energies.

In accordance with another aspect of the invention, the electrical power conversion device further comprises a package mechanically and electrically coupling the electrical power conversion device to the multi junction solar cell.

In accordance with another aspect of the invention, an AC photovoltaic module comprising is provided that includes a plurality of solar cells having a plurality of DC electrical outputs. The plurality of electrical outputs receive a plurality of DC electrical energies from the solar cells. The module also includes a multi-input electrical power conversion device that includes at least one DC-to-AC circuit and at least one MPPT circuit and at least one electrical output receiving at least one AC energy from the electrical power conversion device.

In accordance with another aspect of the invention, the multi junction photovoltaic AC module further comprises a carrier for supporting the solar cells.

In accordance with another aspect of the invention, the multi junction photovoltaic AC module comprises a frame surrounding the carrier.

In accordance with another aspect of the invention, the multi-input electrical power conversion device is removably attachable to the carrier.

In accordance with another aspect of the invention, the multi-input electrical power conversion device is attached to the frame.

In accordance with another aspect of the invention, the multi-input electrical power conversion device is detachable from a remainder of the module.

In accordance with another aspect of the invention, the carrier is adapted to be integrated into at least one component of a building selected from the group consisting of a roof, walls, doors and windows.

In accordance with another aspect of the invention, the multi junction cells are based on a $CuInGaSe_2$ group of materials.

In accordance with another aspect of the invention, An AC photovoltaic system is provided that includes a plurality of AC photovoltaic modules. At least one of AC photovoltaic modules includes: a plurality of solar cells having a plurality of DC electrical outputs, the plurality of electrical outputs receiving a plurality of DC electrical energies from the solar cells; and a multi-input electrical power conversion device that includes at least one DC-to-AC circuit and at least one MPPT circuit. The system also includes an electrical AC wiring arrangement. The plurality of AC photovoltaic modules is electrically coupled in parallel to the electrical AC wiring arrangement.

In accordance with another aspect of the invention, a method of producing AC electrical power is provided. The method includes receiving optical energy and converting the optical energy into multiple DC energies at a plurality of DC outputs associated with a plurality of photovoltaic cells. The DC energies are converted into at least one AC energy using at least one multi-input power conversion device.

DETAILED DESCRIPTION

Overview

In the following detailed description, numerous specific details are set forth in order to provide a thorough understanding of exemplary embodiments or other examples described herein. However, it will be understood that these embodiments and examples may be practiced without the specific details. In other instances, well-known methods, procedures, components and circuits have not been described in detail, so as not to obscure the following description. Further, the embodiments disclosed are for exemplary purposes only and other embodiments may be employed in lieu of, or in combination with, the embodiments disclosed.

As summarized above and described in more detail below, an apparatus for photovoltaic (PV) multi junction solar energy conversion into AC electrical energy and a method for producing the same is provided. Embodiments of this apparatus and method may facilitate the ability to efficiently and economically convert electro-magnetic energy in the form of light into electrical energy in the form of electrical current. Embodiments of this apparatus and method may also facilitate large volume production and widespread usage of photovoltaic devices.

Figure 17:
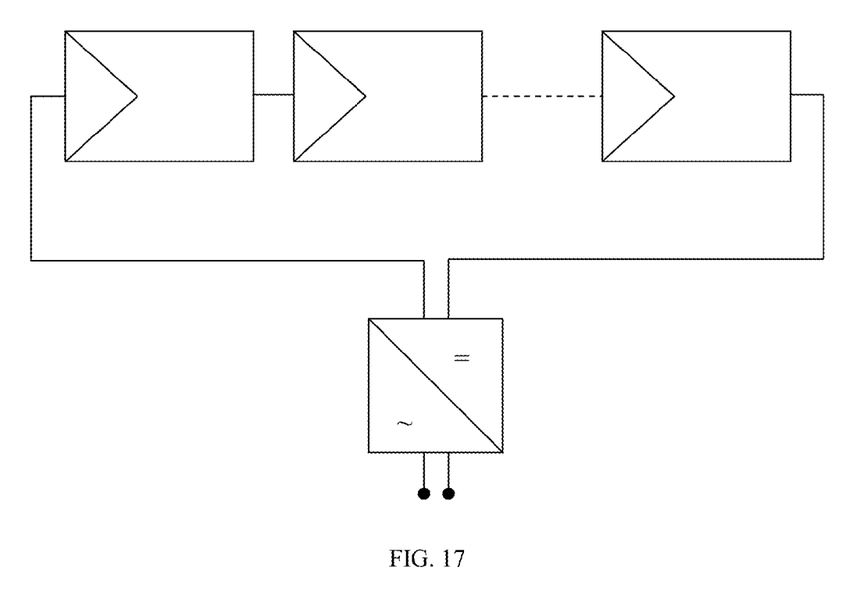
FIG. 17 is a layout of a conventional PV system.

In a conventional PV system 1700 shown in FIG. 17, a number of solar modules 1710 are connected in series to produce a so-called string, which then may be connected to an apparatus for electrical conversion 1720, such as an inverter. The inverter controls the operating conditions on all modules in the string and converts direct current (DC) from the modules into alternating current (AC). The output of the inverter 1720 may be directly connected to the electrical utility grid. Currently, this is the most prevalent form of a PV system design. It suffers from a number of drawbacks, however, such as (a) special and expensive DC-rated wiring is needed between the solar modules and the inverter, (b) a lower efficiency because of a mismatch among different modules in the string, (c) high sensitivity to partial shading and possibility of total loss of power as a result, (d) possible complete loss of power due to failure or partial performance degradation in just one of the modules. Some of these drawbacks are further magnified when such a PV system utilizes multi junction PV cells and modules of the type described below. Thus a conventional approach to PV system design is not suitable for multi junction devices.

Multi junction PV devices in general are a more efficient means for converting solar energy into electricity. However, the development of these devices is currently hindered by the complexity of associated semiconductor manufacturing processes and their relatively high cost. Also, their performance, particularly when used in terrestrial applications, is often degraded by the changes in ambient conditions, such as temperature, sun position, atmospheric conditions, etc. Some of the performance limitations of a multi-junction PV device arise from the so-called current matching condition, which dictates that the electrical currents through all the junction layers in this device must be equal to each other. This condition is a consequence of a serial interconnection between different junctions in a typical multi junction device, as produced, for example, by Uni-Solar®, Spectrolab® or Emcore®.

Figure 1:
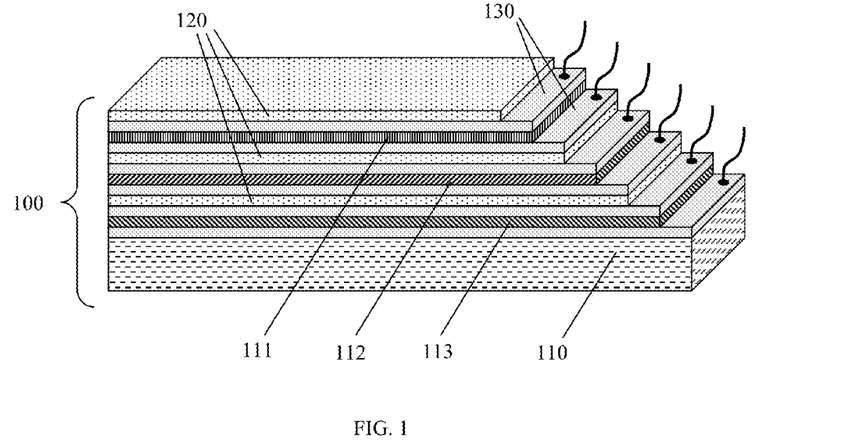
FIG. 1 is a multi junction solar cell with multiple contacts.

An alternative multi junction PV device or cell 100 may be produced as shown in FIG. 1, in which each junction layer (layers 111, 112 and 113) includes at least one junction with an optically active semiconductor having a specific bandgap, as disclosed in patent application Ser. No. 11/714,681 entitled "Spectrally adaptive multi junction photovoltaic thin film device and methods of producing the same", filed Mar. 6, 2007, which is hereby incorporated by reference in its entirety. Of course, each so-called junction layer includes at least two sublayers that define a junction at their interface. The junction may be a heterojunction in which the sublayers are formed of dissimilar materials. Alternatively, the junction may be of any type known in the art such as, but not limited to, p-i-n junctions, MIS junctions and the like. The number of junction layers, N, may be larger than two. For example, three junction layers are shown in FIG. 1. Also, the semiconductor material may be, for example, a compound semiconductor formed from an inorganic, polymer-based material, an organic dye-based material, a nanoparticle composite material, a quantum dot composite material, or a mixture of the above materials. These junction layers may be situated in a stack one above another in this multi-layered device. When this photovoltaic device is illuminated by light, each one of its junction layers may absorb a part of light with photon energies above a corresponding bandgap and transmit a part of light with photon energies below a corresponding bandgap. These junction layers may be arranged so that the bandgaps of lower lying junctions are smaller than the bandgaps of higher lying junctions; this condition improves the conversion efficiency of the device. Furthermore, these junction layers may be electrically isolated from each other by layers 120 and provided with at least two individual electrical contacts 130 of opposite polarity for producing electrical current. The topmost layer 120 in FIG. 1 is optional. All the junction layers may be attached to a common substrate or a carrier 110 that may be sturdy yet flexible. The substrate also may be coated with a reflective layer. One or more surfaces in this device could be textured to provide a relief pattern for multiple light reflections and scattering, which increase absorption length and improve conversion efficiency.

The design of PV device or cell 100 does not require satisfaction of the current matching condition, in which electrical currents produced in each junction must be equal. If current matching is unnecessary in a multi junction PV cell, then a number of new and different thin-film PV technologies may be utilized for its production, such as, for example CdTe and $CuInSe_2$-based technologies. This may dramatically lower the cost of multi junction cell manufacturing, while increasing its energy efficiency and making it competitive with the best of Si and GaAs-based solar cells. However, as shown, in this case separate electrical contacts may be needed for each junction layer. Thus for instance, the three junction cell in FIG. 1 may have up to six individual contacts 130. When compared to a regular PV cell with just two electrical terminals, a multi junction PV cell with a larger number of terminals may be impractical for most PV installations. Therefore a better solution is required for implementation of such multi junction cells, which would not only deliver higher power efficiency, but would also be practical and attractive from a user's point of view.

Figure 2:
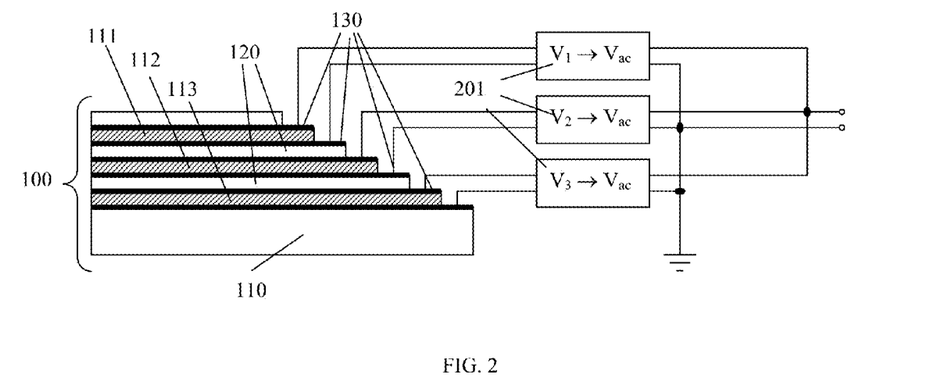
FIG. 2 is a multi junction solar cell with multiple contacts connected to multiple inverters.
Figure 3:
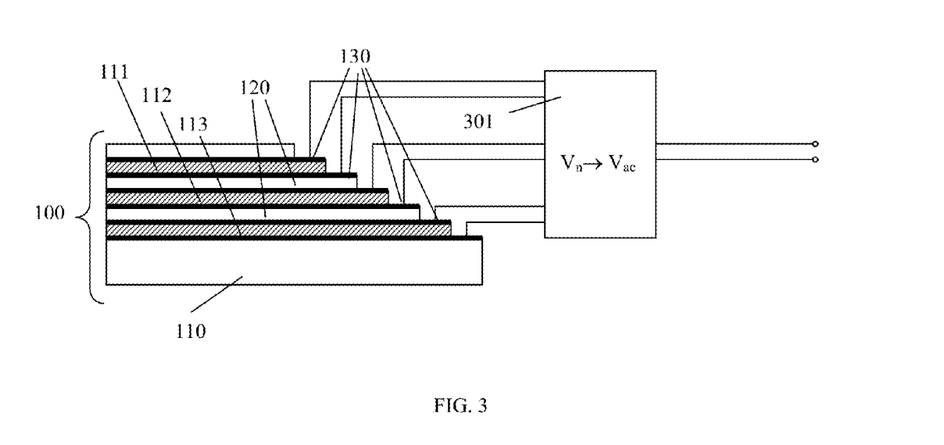
FIG. 3 is a multi junction solar cell with multiple contacts connected to a multi-input inverter.

A N-junction solar cell may have up to N different pairs of electrical terminals, each one having a different set of output current and voltage, as determined by the amount of absorbed light in a given junction layer, its efficiency and a corresponding load. These sets of current and voltage are generally independent of each other, and usually corresponding terminals cannot be directly interconnected. Intermediate electrical matching circuits are necessary in order to interconnect independent junction layers and reduce the total number of output electrical terminals. FIG. 2 shows a schematic, in which a three-junction PV cell 100, having three independent pairs of terminals producing voltages $V_1$, $V_2$ and $V_3$, is connected to three separate electrical converters, such as inverters 201. The outputs of the inverters are matched to produce the same output voltage $V_{ac}$, so that they may be connected to the same pair of output terminals or grid. Alternatively, FIG. 3 shows a schematic, in which a three junction PV cell 100, having three independent pairs of terminals producing voltages $V_N=V_1$, $V_2$ and $V_3$, is connected to a multi-input inverter 301, so that its output could be connected to a single pair of output terminals or grid.

Figure 7:
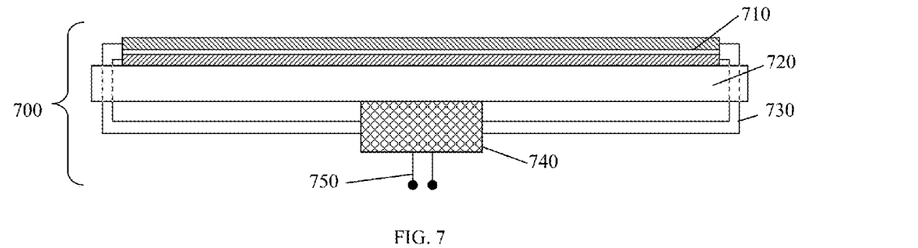
FIG. 7 is an exemplary embodiment of a two junction AC PV module.
Figure 8:
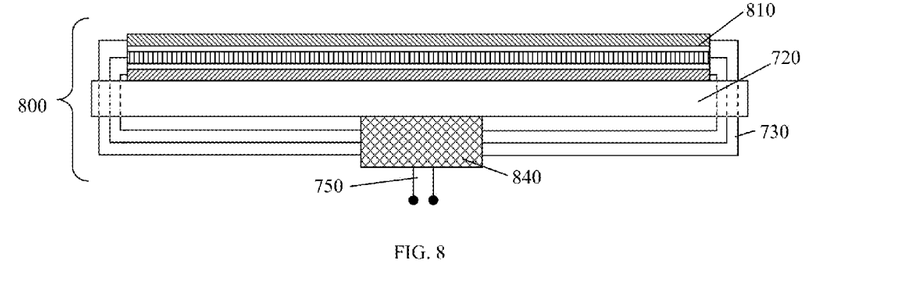
FIG. 8 is an exemplary embodiment of a three junction AC PV module.

Whereas a multi-input inverter may not be a sufficiently attractive device for use in a conventional PV system utilizing conventional single-junction PV cells, it may be a very attractive device for use in PV systems utilizing multi junction PV cells. Its utility becomes particularly high, when the multi-input inverter is integrated directly onto a multi junction PV module as shown in FIGS. 7 and 8.

EXAMPLES

Variations of the apparatus and method described above are possible without departing from the scope of the invention. Some illustrative examples will be presented below.

Figure 4:
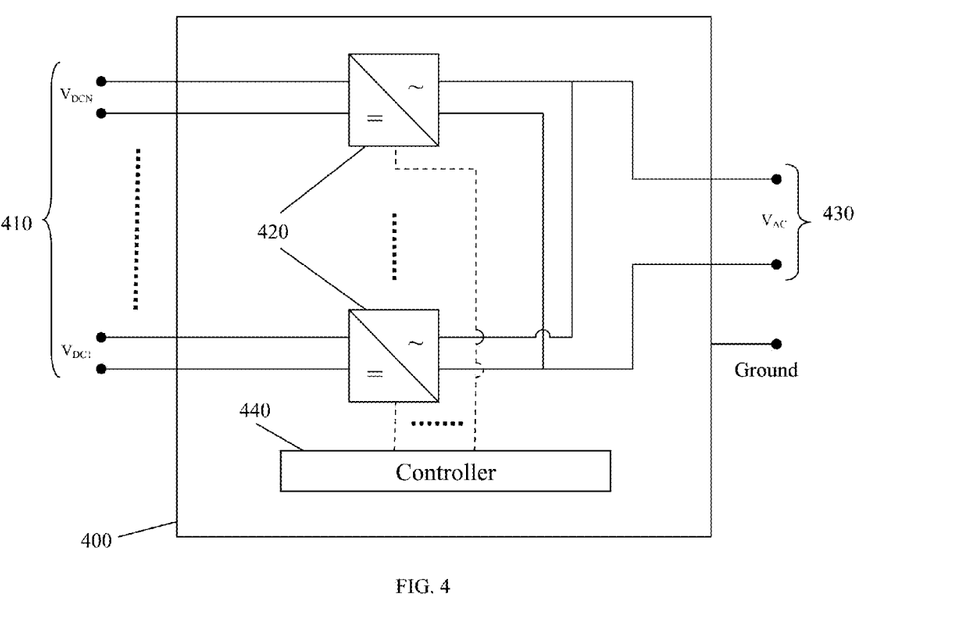
FIG. 4 is an exemplary layout of a multi-input inverter.
Figure 5:
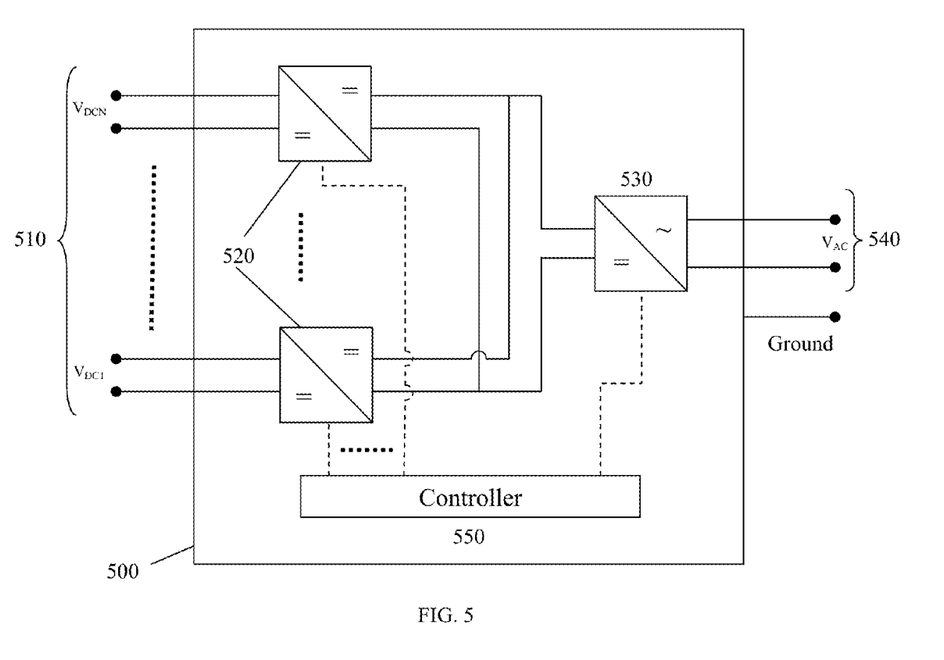
FIG. 5 is another exemplary layout of a multi-input inverter.

The multi-input inverter may have different electrical layouts, two of which are shown in FIGS. 4 and 5. The inverter 400 in FIG. 4 may have N pairs of input terminals 410 accepting DC voltages $V_{DC1}$ through $V_{DCN}$. Each input terminal 410 may be connected to at least one inverting circuit 420, so that the output of each inverting circuit 420 may be connected to at least one pair of output terminals 430 producing AC voltage $V_{AC}$. Optionally, there also may be at least one additional ground terminal Controller 440 is used to control operation of inverting circuits 420, by providing individual monitoring and maximum power point tracking (MPPT) capabilities at each input terminal pair. Many specialized control algorithms for MPPT have been developed to constantly extract the maximum amount of power from the array under varying conditions.

The inverter 500 in FIG. 5 may have N pairs of input terminals 510 accepting DC voltages $V_{DC1}$ through $V_{DCN}$. Each input terminal may be connected to at least one DC-to-DC converter or booster circuit 520, so that input DC voltages may be converted to a common DC voltage. As a result, the output of each booster circuit 520 may be connected to at least one inverting circuit 530 producing AC voltage $V_{AC}$ at the output terminals 540. Optionally, there also may be at least one additional ground terminal Controller 550 is used to control operation of booster circuits 520 and inverting circuit 530, by providing individual monitoring and MPPT capabilities at each input terminal pair. All of the above electronic components may be housed on a single board inside a single package.

Generally, DC-to-DC and DC-to-AC converter circuits may include high frequency electrical switches. For example, an inverter may work by switching its output state between positive and negative DC voltage values. Switches are controlled by a controller, e.g. a digital signal controller (DSC). Typically, a controller uses pulse width modulation (PWM) technique to control operating characteristics of a converter circuit and circuit's output parameters such as current, voltage, power and frequency. Additional elements in these circuits may include low-pass filters, necessary to eliminate high frequency harmonics.

Figure 6:
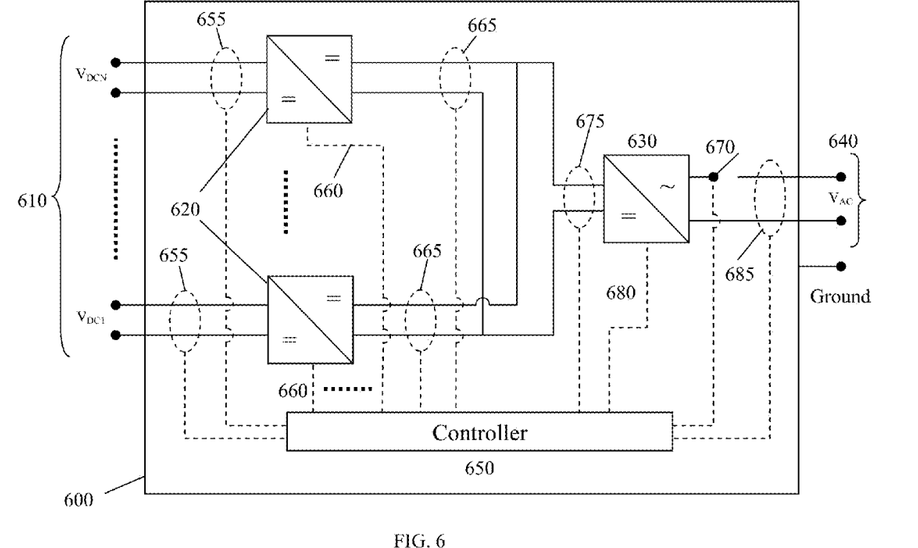
FIG. 6 is another exemplary layout of a multi-input inverter, showing additional control circuits.

The above examples of multi-input inverters are not exhaustive of the types of inverters that may be employed. For example, the above examples illustrate single-phase inverters; however, multi-phase multi-input inverters may be produced using similar approaches. A number of input and/or output terminals may be reduced by providing common terminals (e.g. a ground terminal). Furthermore, additional elements necessary for inverter operation may also be included, for example such as those shown in FIG. 6. Although the layout of inverter 600 may be similar to that of inverter 500, some additional circuit elements are shown. Input sensor circuits 655 may be needed to monitor electrical input terminals 610, by measuring corresponding currents and voltages. Similarly, sensor circuits 665 may be used to monitor the outputs of booster circuits 620. These sensors may be used in a closed loop control of booster circuits by controller 650 via control circuits 660. Up to N number of independent control loops may be produced in order to enable individual MPPT for all boosters 620. Additional, sensor circuits 675 and 685 may be provided to monitor the electrical input of inverting circuit 630 and output terminals 640, respectively. Circuit 685 may be used to monitor the utility grid, in case when inverter 600 is connected to the utility grid. In case of power outage to prevent islanding, the controller may disconnect the inverter from the grid using internal switch 670. Anti-islanding protection may be one of the required functionalities for a utility grid-connected power source, in case of a complete grid-wide power failure all distributed power sources must be automatically disconnected. Otherwise, control circuit 680 may be used to control the current and match the output of inverter circuit 630 to the specific characteristics of the utility grid, such as its voltage, frequency and phase.

One of the primary functions of a multi-input controller is to provide MPPT circuits for each of its DC inputs with capabilities to maximize corresponding electrical powers. There may be various MPPT algorithms, in which input current and voltage are scanned and measured to determine the power. A controller compares different power values and selects operating points with a higher value. Such an MPPT scan may be continuous (i.e. uninterruptable) and simultaneous at all inputs, or alternatively it may be accomplished in sequence, so that only one input is optimized at a time.

Additional circuit elements may also be used in a multi-input inverter, such as DC disconnect switches on one or more input terminals, power metering circuits for system performance and usage monitoring, user interface and display, microprocessors for inverter programming and smart control implementation, digital memory for data storage, and others, which further augment the inverter capabilities without affecting its primary function. Furthermore, some elements of a multi-input inverter may be identical in their design and functionality. For example, inverting circuits 420 in FIG. 4 may be identical to each other if the input power requirements at input terminals 410 are the same, so that at least maximum input voltages $V_{DC1}$ through $V_{DCN}$ are the same. Similarly, booster circuits 520 in FIG. 5 may be identical to each other. This design approach simplifies the multi-input inverter design and lowers its cost. Alternatively, if the input power requirements at the input terminals (e.g, input terminals 410 in FIG. 4 and 510 in FIG. 5) are not the same, further multi-input inverter design optimization is possible. For example, inverting circuits 420 in FIG. 4 may be different from each other and optimized for different input powers and different input voltages $V_{DC1}$ through $V_{DCN}$ at the input terminals 410. Similarly, booster circuits 520 in FIG. 5 may be different from each other and optimized for different input powers and different input voltages $V_{DC1}$ through $V_{DCN}$ at the input terminals 510.

In an exemplary embodiment shown in FIG. 7 an integrated two junction AC PV module 700 is comprised of two junction cell 710, carrier 720, internal DC wiring 730, two-input inverter 740 and external AC terminals 750. FIG. 8 shows a three junction AC PV module, comprised of analogous elements. In FIGS. 7 and 8, like elements are denoted by like reference numerals. Similarly, an N-junction AC module may be produced from an N-junction PV cell and N-input inverter using the same approach. To produce either two-junction, three-junction or N-junction PV cells, low cost thin-film technologies may be used, such as those based on a-Si, CdTe and CuInGaSe$_2$. Alternatively, more expensive approaches based on crystalline III-V semiconductors, such as GaAs, may also be used. Hybrid multi junction PV cells may be produced using different technologies, by combining, for instance, GaAs and CuInSe$_2$ PV cells on top of each other. Both types of inverters shown in FIGS. 4 and 5 may be used in a multi junction AC PV module. Typically, the output power of a single PV module is in the range of 10 to 300 W, which is substantially less than the output power of a conventional commercial inverter (1000 to 6000 W). Thus additional design optimization may be required for the design of multi-input inverter 740 design, aimed at reducing the inverter's cost, size and weight and maintaining high conversion efficiency. In particular, transformerless inverter circuits may be attractive for this purpose.

Also, it may be preferred to have a carrier 720 with an integrated frame, which may provide additional mechanical support and damage protection. Additional structural support elements may be included in the carrier, especially in cases when an AC PV module surface area is large, e.g. larger than 0.6 m$^2$. The carrier may be made from light-weight plastic sheet, metal foil, glass panel and other appropriate, similar planar materials. Furthermore, it may be preferred to conceal DC wiring 730 from access by regular end users and also protect it from exposure to weather for improved safety and reliability. Furthermore, it may be preferred to attach inverter 740 to the back of the carrier 720, in order to leave the top surface of the module fully open to sunlight and to provide shade and cooling to the inverter. The location of the inverter 740 on the backside of carrier 720 may differ from the one indicated in FIG. 7 without changing its functionality. For example, such an inverter may be integrated into the frame. Also, it may be preferred to produce inverter 740 in a flat form factor where the thickness of its package is substantially smaller than its length and width, so that it may have a larger surface for air cooling and could be fully hidden inside the recess of the frame or carrier 720.

Figure 9:
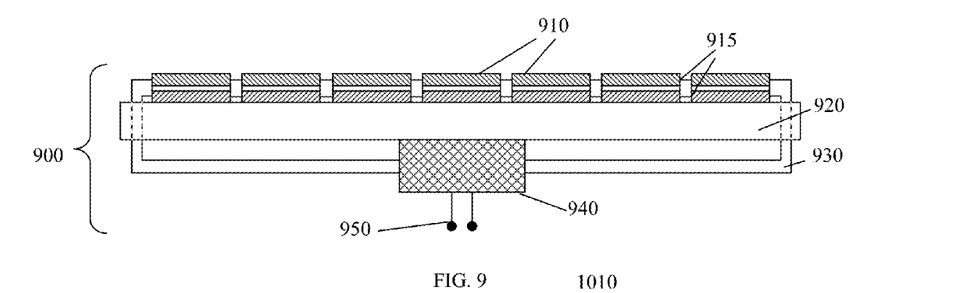
FIG. 9 is another exemplary embodiment of a two junction AC PV module.
Figure 10:
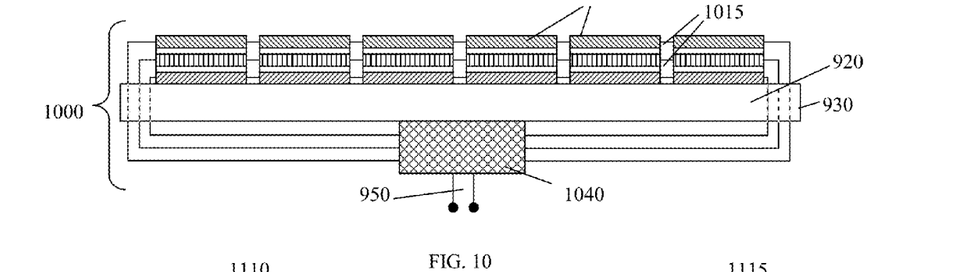
FIG. 10 is another exemplary embodiment of a three junction AC PV module.

The junction layers of a multi junction PV cell in a multi junction AC module may in turn be composed of interconnected strings of individual cells. For example, at least one of the junction layers in the three junction cell of FIG. 1 (i.e., junctions 111, 112, 113) may be sectioned into several smaller cells and monolithically interconnected in series to produce a cell string within a single junction layer. This procedure is in fact often done in the production of thin-film single junction devices based on amorphous Si and CdTe. Alternatively, several multi junction cells could be hybridly interconnected into strings. A two junction AC PV module 900 with a string of two junction cells 910 is shown in FIG. 9. Pairs of connectors 915 are used to interconnect cells 910, so that each junction layer in a given cell is connected to the same junction layer in a neighboring cell, as shown in FIG. 9. The end terminals 930 of the two junction string may be connected to the terminals of the two-input inverter 940 with the output AC terminals 950. Similarly, a three junction AC PV module may be produced as shown in FIG. 10, by stringing together several three-junction PV cells and connecting the resulting string to a three-input inverter. Furthermore, an N-junction AC module may be produced using strings of N-junction cells attached to an N-input inverter. Alternatively, in another embodiment a combination of N single input inverters connected to a single output AC terminal may be used in place of the N-input inverter. In yet another embodiment of an N-junction AC PV module, an arbitrary combination of $n_i$ inverters with i number of inputs may be used if the following condition is met:

$$\sum_{i=1}^{N} i \cdot n_i = N. \qquad (1)$$

Figure 11:
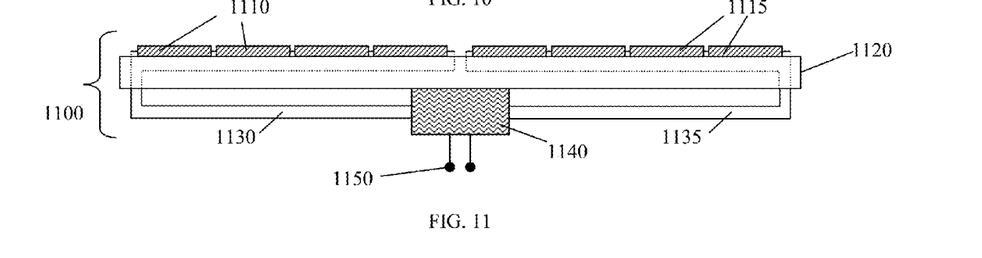
FIG. 11 is an exemplary embodiment of a two-string AC PV module.

In yet another embodiment shown in FIG. 11, an AC PV module 1100 consists of a number of PV cells 1110 and 1115 positioned on a carrier 1120 and connected to a two-input inverter 1140 with AC terminals 1150. PV cells 1110 and 1115 may be single-junction cells or regular multi junction cells with two DC output terminals. PV cells 1110 are interconnected to produce one string of PV cells, which is then connected to inverter 1150 using wires 1130. PV cells 1115 are interconnected to produce a second string of PV cells, which is then connected to inverter 1150 using wires 1135. Similarly, additional strings of PV cells may be produced and connected to additional input terminals of an integrated multi-input inverter. Thus, an AC PV module may be produced having N independent strings of PV cells, which may be connected to respective terminals of N-input inverter. In general, an AC PV module may be produced having N-junction PV cells interconnected into M independent strings (e.g. M=kN, where k=1, 2, . . . ), which may then be connected to an integrated M-input inverter.

Different strings in such an AC PV module may experience different operating conditions, due to differences in solar illumination, shading or performance variations from cell to cell, which produce different output powers and thus require different MPPT capabilities. For example in the worst case scenario, in the normal course of its operation the left half of module 1100 in FIG. 11 may be completely or partially shaded, whereas the right half of module 1100 may remain completely exposed to sunlight. In this situation, both halves will function normally and produce the maximum possible output power. In contrast, in a conventional PV module, where both halves of the module are parts of the same string, the total output power of the module may drop to zero.

Figure 12:
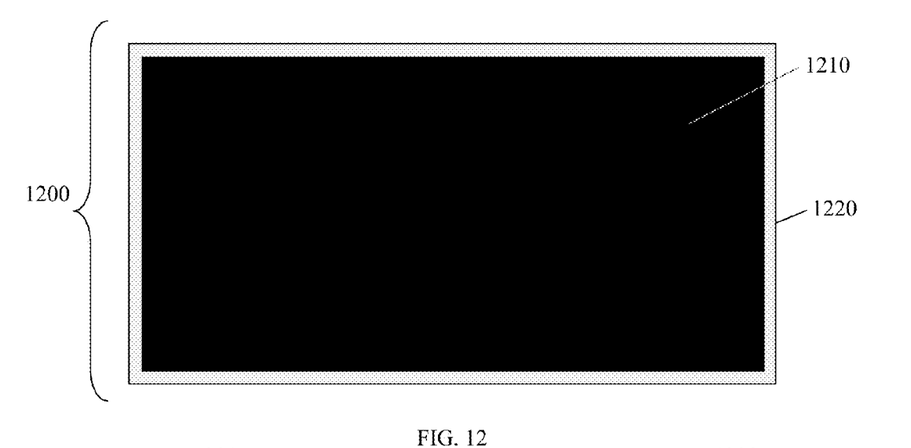
FIG. 12 is a front side of a monolithically integrated multi junction AC PV module.
Figure 13:
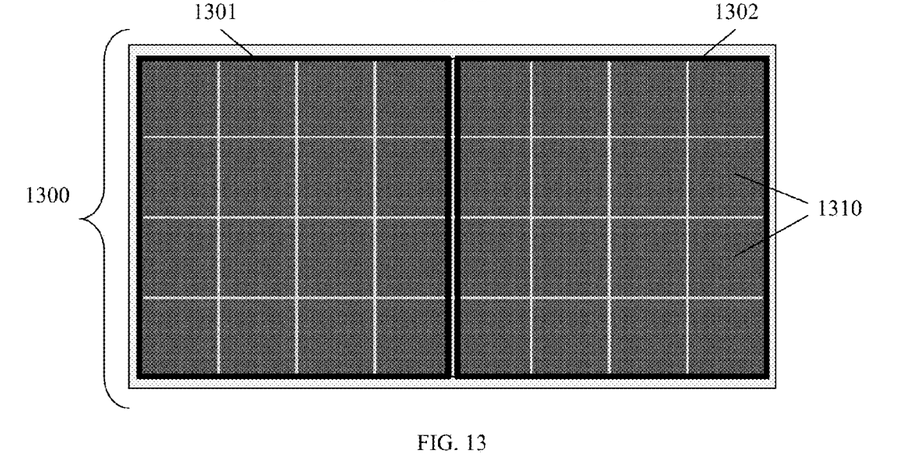
FIG. 13 is a front side of a hybridly integrated multi junction AC PV module.
Figure 14:
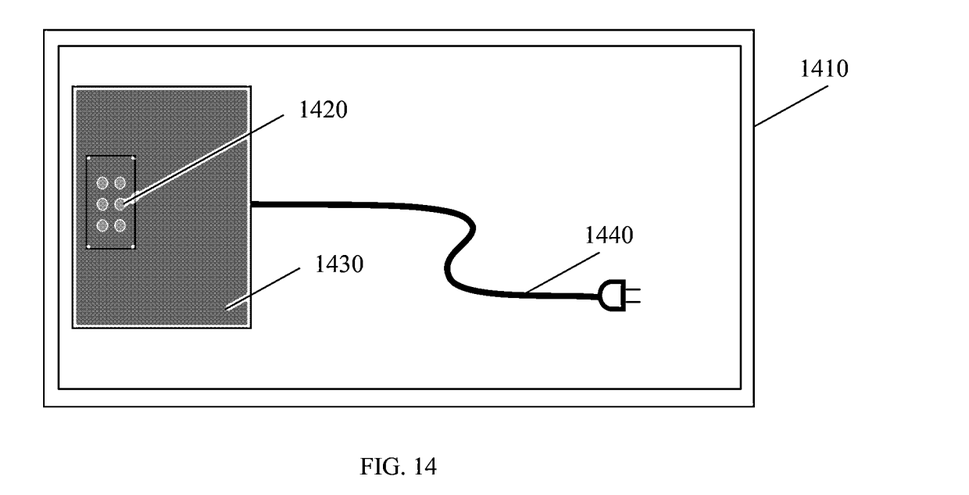
FIG. 14 is back side of a multi junction AC PV module with a detachable multi-input inverter.

FIG. 12 shows the front or top side of an exemplary embodiment of a multi-junction AC PV module 1200, in which a single monolithically integrated multi junction PV cell 1210, e.g. similar to cell 710 in FIG. 7, may be used. Also, frame 1220 is used for structural support of the module and mechanical edge protection; it may for example be made of plastic for low weight or metal (e.g. aluminum) for better mechanical strength. FIG. 13 shows the front or top side of another exemplary embodiment of an AC PV module 1300, in which multiple single- and/or multi junction cells 1310 (e.g. similar to cells 910 in FIG. 9) may be used. Furthermore, the surface of module 1300 may be sectioned in equal or unequal parts, e.g. left half 1301 and right half 1302, so that each part may contain at least one independent string of PV cells. A sectioned AC PV module 1300 may be less sensitive to shading: more sections provide lesser sensitivity. FIG. 14 shows the backside of an exemplary embodiment of a multi junction AC PV module, in which multi-input inverter 1430 may be attached to carrier with a frame 1410 and may make electrical contact with multi junction solar cells on the front side of the module via internal DC junction box 1420. Means 1440 of connecting to an external load or utility grid may be also provided. In other alternative embodiments of an AC PV module, the multi-input inverter may be positioned on the front side of the module. This approach allows better cooling and easy service access to the inverter and may be necessary if access to the backside of the module is difficult or prohibitive. In this case a special area on the front surface of an AC PV module may be reserved for mounting a multi-input inverter.

Figure 15:
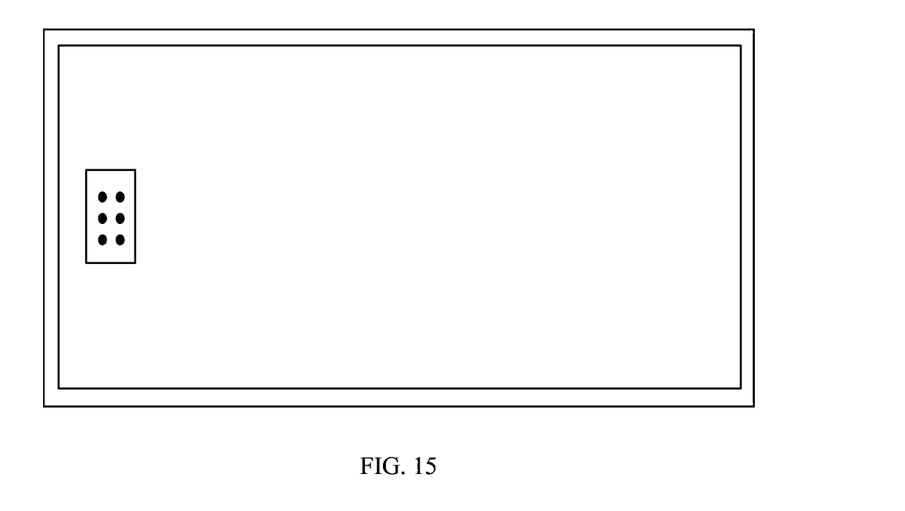
FIG. 15 is back side of a multi junction AC PV module without a detachable multi-input inverter.

Attachment of inverter 1430 to carrier 1410 may or may not be permanent, such as attachment accomplished by gluing, soldering or welding. Instead, it may be beneficial to provide means of uncomplicated electrical and mechanical disconnect of the inverter housing from the carrier. Since typically the lifetime of an inverter is smaller than the lifetime of a solar cell, it may be necessary to replace a failed inverter at least once during the lifetime of an AC PV module. Thus inverter 1430 may be bolted, screwed, clamped or otherwise removably (i.e., non-permanently) and mechanically attached to carrier 1410 with a frame providing simultaneous electrical connection to PV cells via junction box 1420. Additional waterproof sealing around the inverter may be needed to protect the module from the effects of weather. When the need arises, one may easily detach and remove the inverter from the rest of the AC PV module as shown in FIG. 15 and replace it with a new inverter. This approach to AC PV module design is also generally useful for recycling purposes and it also enables easy upgrades when better equipment becomes available.

Figure 16:
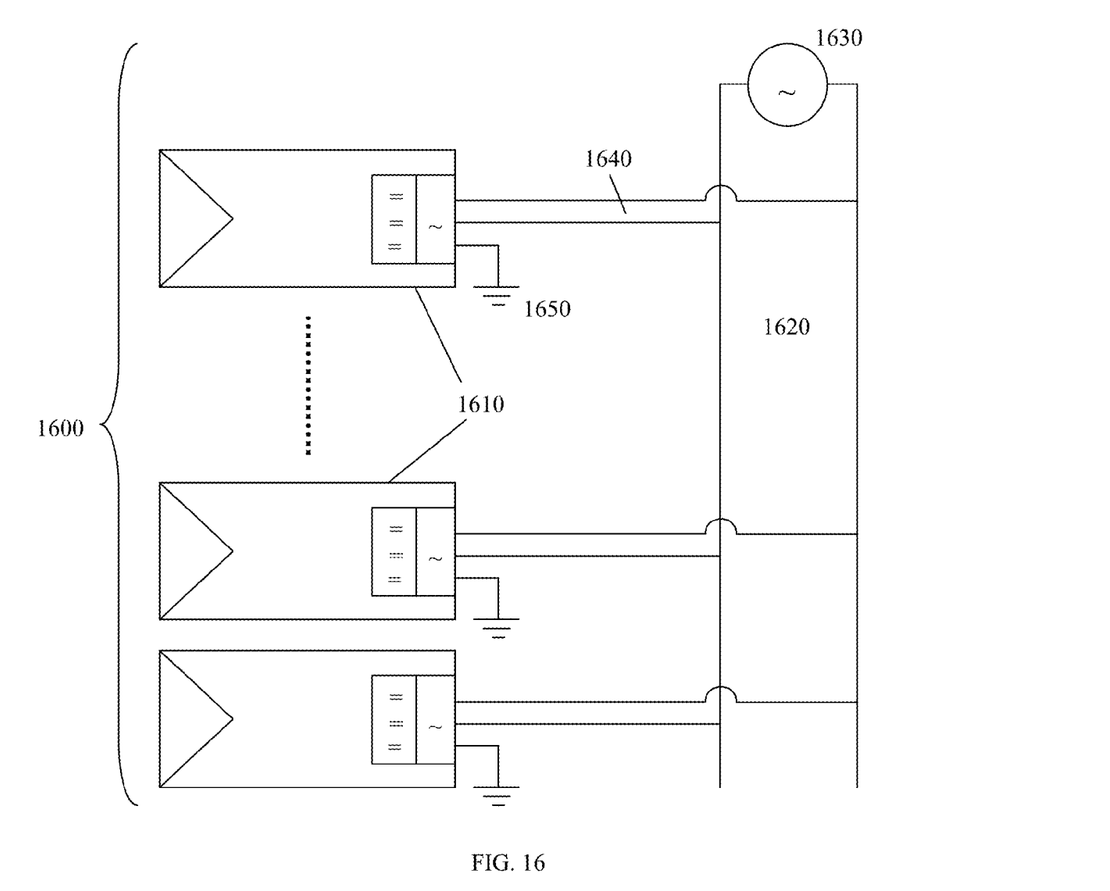
FIG. 16 is an electrical layout of an AC PV system.

In another embodiment shown in FIG. 16 a PV system 1600 is provided comprised of plurality of multi junction AC modules 1610 and means of electrical connection 1620 to an AC load or a utility grid 1630. In this case every AC module 1610 is provided with at least two terminals 1640 for AC power outlet and optional grounding terminal 1650. AC outputs of all modules are synchronized and matched, so that they could be connected electrically in parallel. AC modules in this system may or may not be identical and instead may differ from each other in one or another aspect. For example, in one embodiment the AC PV system 1600 described in FIG. 16 may include at least one single-junction AC PV module; in another embodiment it may include at least one two junction AC PV module; and yet in another embodiment it may include at least one three-junction AC module. This feature is a significant advantage of the AC PV system 1600 in comparison to a conventional PV system: individual AC PV modules do not have to be matched to each other. It also allows straightforward repairs, replacement and upgrades of its constituent parts. It doesn't have any exposed DC parts and therefore it is more reliable and safer. Each AC module is individually controlled and tracked, thus providing superior performance as compared to that of a regular PV system. This system is also less sensitive to shading and it does not suffer from power outages caused by a mismatch between operating points (i.e., the sets of the module's output voltage and current) of different modules in the system. Its operation is very stable and highly resistant to failure due to built-in redundancy of in-parallel connected AC PV modules. Unlike a conventional PV system, an AC PV system will not fail if one of its constituent AC modules fails. In fact, the AC PV system may function and continue to deliver power at its best possible efficiency even when most of its AC PV modules have failed.

AC PV system 1600 is modular in nature, i.e. it can be modified, changed, updated, upgraded, fixed and repaired even after installation, and thus is very adaptable to a variety of applications. It is particularly suitable for use in residential solar installations due its user-friendly design. Furthermore, such a system is particularly useful in building-integrated photovoltaics (BIPV), where insensitivity to shading and system resilience to various forms of failure are very important. In this application, multi junction AC PV modules can directly be integrated into the walls, roofs and windows and other parts of a building. Furthermore, installation of a multi junction AC PV system may be much more straightforward than that of a conventional PV system, may not require special electrical installer certification and may lead to much lower installation costs.

The above embodiments provide an apparatus and methods that facilitate introduction of more efficient solar technology into the mainstream commercial PV market. Currently, the most efficient multi junction PV cells are only used in special applications, such as in concentrator PV or space PV where high manufacturing costs are not an issue. This invention may enable full scale penetration of multi junction technology into other areas of commercial PV, e.g. residential PV. Residential installation of currently existing high-performance multi junction GaAs-based PV cells is cost prohibitive. Existing multi junction cells based on amorphous Si are not providing high performance. New thin-film technologies and cell design may provide much higher performance, but their practical implementation is currently hindered by the limitations of existing approaches to the design of PV cells, modules and systems. AC PV modules that have been proposed in the past were based on conventional single junction PV cells and thus did not achieve commercial success due to their relatively higher component cost. Multi-junction and multi-string AC PV modules and systems, on the other hand, may not only provide better performance, but also lower end user costs due to a unique combination of features and characteristics associated with multi junction technology and AC PV modules with integrated multi-input inverter designs.

What is claimed is:

1. A multi-input electrical power conversion device for converting multiple DC energies each arising from different junctions in a multi junction solar cell into AC energy, comprising:
   a plurality of electrical input pairs for receiving the multiple DC energies from at least one multi junction solar cell, each of the electrical input pairs being in physical contact with a pair of electrical contacts in the multi-junction solar cell between which one of the junctions is located;
   a plurality of DC-to-AC inverting circuits each for receiving the DC energy from a different one of the plurality of electrical input pairs, each of the DC-to-AC inverting circuits having a pair of inputs that physically contact one of the electrical input pairs that receive the DC energy;
   at least one electrical output receiving at least one AC energy from the plurality of DC to AC inverting circuits;
   at least one MPPT circuit operatively coupled to the DC to AC inverting circuits;
   a package housing the plurality of electrical input pairs, the plurality of DC-to-AC inverting circuits, the at least one electrical output and the at least one MPPT circuit.

2. The electrical power conversion device of claim 1 further comprising an AC disconnect switch for disconnecting the electrical output under control of the MPPT circuit.

3. The electrical power conversion device of claim 1 further comprising at least one DC to DC circuit coupling the electrical inputs to the plurality of DC-AC inverting circuits.

4. The electrical power conversion device of claim 3 further comprising a number of said DC-to-DC inverting circuits that is equal to the number of said DC energies.

5. The electrical power conversion device of claim 1 further comprising a number of said DC-to-AC inverting circuits that is equal to the number of said DC energies.

6. The electrical power conversion device of claim 1 further comprising a number of said MPPT circuits that is equal to the number of said DC energies.

7. The electrical power conversion device of claim 1 further comprising a carrier configured to support the package on a first side thereof and to support the multi junction solar cell on a second side thereof opposing the first side.

8. The electrical power conversion device of claim 7 wherein the package has a flat form factor having a thickness that is less than its length and width.

9. The electrical power conversion device of claim 1 wherein the plurality of electrical input pairs receive the multiple DC energies from a single multi junction solar cell.

10. The electrical power conversion device of claim 1 further comprising a controller operative coupled to each of the DC-AC inverting circuits, the controller including the at least one MPPT circuit.

11. The electrical power conversion device of claim 10 further comprising a plurality of sensors each monitoring one of the electrical input pairs, the sensors being operatively coupled to the controller.

12. The electrical power conversion device of claim 1 wherein the DC-to-AC inverting circuits are each differently configured for receipt of different input powers and/or voltages.

13. The electrical power conversion device of claim 1 wherein the at least one multi-junction solar cell includes a plurality of multi junction solar cells serially interconnected with one another.

14. The electrical power conversion device of claim 1 wherein the at least one multi-junction solar cell includes a first plurality of multi junction solar cells serially interconnected with one another and a second plurality of multi junction solar cells serially interconnected with one another such that the multi junction solar cells in the first plurality of multi junction solar cells are not serially interconnected with the multi junction solar cells in the second plurality of multi junction solar cells.

15. An AC photovoltaic module comprising:
   at least one multi junction solar cell having at least two pairs of DC electrical outputs each associated with a different junction in the multi junction solar cell, each of said DC electric output pairs receiving DC electrical energy from the junction with which it is associated;
   a multi-input electrical power conversion device, said multi junction electrical power conversion device also including a plurality of DC-to-AC circuits and at least one MPPT circuit, each of the DC-to-AC circuits being in physical contact with one of the pairs of DC electrical outputs to receive the DC electrical energy therefrom;
   at least one electrical output receiving at least one AC energy from the electrical power conversion device.

16. The photovoltaic AC module of claim 15 wherein the multi-input electrical power conversion device further comprises at least two DC to DC circuits.

17. The photovoltaic AC module of claim 15 further comprising a carrier for supporting the solar cells and the multi-input electrical power conversion device.

18. The photovoltaic AC module of claim 17 further comprising a frame surrounding the carrier.

19. The photovoltaic AC module of claim 18 wherein said multi-input electrical power conversion device is attached to said frame.

20. The photovoltaic AC module of claim 17 wherein said multi-input electrical power conversion device is electrically and mechanically connectable to and disconnectable from said carrier.

21. The photovoltaic AC module of claim 17 wherein the carrier is adapted to be integrated into at least one component of a building selected from the group consisting of a roof, walls, doors and windows.

22. The photovoltaic AC module of claim 15 wherein said multi-input electrical power conversion device is detachable from a remainder of said module.

23. The photovoltaic AC module of claim 15 wherein said at least one multi-junction solar cell comprises at least two strings of photovoltaic cells.

24. The photovoltaic AC module of claim 15 wherein said plurality of DC electrical outputs is three DC electrical outputs.

25. A multi-input electrical power conversion device for converting multiple DC energies each arising from different junctions in a multi junction solar cell into AC energy, comprising:
   a plurality of electrical input pairs for receiving the multiple DC energies from at least one multi junction solar cell;
   a plurality of DC-to-DC converters each for receiving the DC energy from a different one of the plurality of electrical input pairs, the DC energies being converted to a common DC energy;
   a common DC-to-AC inverting circuit having an input pair for receiving the common DC energies from the plurality of DC-to-DC converters;
   at least one electrical output receiving at least one AC energy from the plurality of DC to AC inverting circuits; and a controller operative coupled to each of the DC-DC inverting circuits and the common DC-to-AC inverting circuit, the controller including a MPPT circuit.

26. The electrical power conversion device of claim 25 further comprising a first plurality of sensors each monitoring one of the electrical input pairs, the first plurality of sensors being operatively coupled to the controller.

27. The electrical power conversion device of claim 26 a second plurality of sensors each monitoring a pair of outputs from one of the DC-to-DC converters, the second plurality of sensors being operatively coupled to the controller.

28. The electrical power conversion device of claim 27 wherein the controller is configured to independently control each of DC-to-DC converters in a closed-loop control manner.

29. The electrical power conversion device of claim 27 further comprising a third sensor monitoring the common DC energies received by the input pair of the common DC-to-AC inverting circuit, the third sensor being operatively coupled to the controller.

30. The electrical power conversion device of claim 29 further comprising a fourth sensor monitoring the at least one electrical output from the common DC to AC inverting circuit, the fourth sensor being operatively coupled to the controller.

* * * * *